(12) United States Patent
Yi et al.

(10) Patent No.: US 9,007,099 B2
(45) Date of Patent: Apr. 14, 2015

(54) SEMICONDUCTOR DEVICE WITH A CURRENT SAMPLER AND A START-UP STRUCTURE

(71) Applicant: Suzhou Poweron IC Design Co., Ltd, Suzhou (CN)

(72) Inventors: Yangbo Yi, Suzhou (CN); Haisong Li, Suzhou (CN); Ping Tao, Suzhou (CN); Wengao Chen, Suzhou (CN); Lixin Zhang, Suzhou (CN)

(73) Assignee: Suzhou Poweron IC Design Co., Ltd (CN)

( * ) Notice: Subject to any disclaimer, the term of this patent is extended or adjusted under 35 U.S.C. 154(b) by 0 days.

(21) Appl. No.: 14/227,931

(22) Filed: Mar. 27, 2014

(65) Prior Publication Data

US 2014/0292380 A1    Oct. 2, 2014

(30) Foreign Application Priority Data

Apr. 2, 2013   (CN) .......................... 2013 1 0112448

(51) Int. Cl.
*H03K 3/00* (2006.01)
*G05F 1/46* (2006.01)
*H03K 17/082* (2006.01)

(52) U.S. Cl.
CPC .............. *G05F 1/462* (2013.01); *H03K 17/082* (2013.01)

(58) Field of Classification Search
CPC ............................... G05F 1/462; H03K 17/082

USPC ........................... 327/108, 112; 257/E27.016
See application file for complete search history.

(56) References Cited

U.S. PATENT DOCUMENTS

| 5,382,826 | A  | * | 1/1995  | Mojaradi et al. ............... 257/489 |
| 5,498,899 | A  | * | 3/1996  | Palara ............................ 257/536 |
| 5,714,396 | A  | * | 2/1998  | Robb et al. ..................... 438/510 |
| 6,229,355 | B1 | * | 5/2001  | Ogasawara ..................... 327/108 |
| 7,057,240 | B2 | * | 6/2006  | Topp et al. ..................... 257/370 |
| 7,498,651 | B2 | * | 3/2009  | Van Zeghbroeck ........... 257/483 |
| 7,803,643 | B2 | * | 9/2010  | Hall et al. ....................... 438/17 |
| 8,598,637 | B2 | * | 12/2013 | Hsing et al. .................... 257/272 |
| 8,624,322 | B1 | * | 1/2014  | Su et al. ......................... 257/359 |

* cited by examiner

*Primary Examiner* — Kenneth Wells
(74) *Attorney, Agent, or Firm* — Matthew A. Pequignot; Pequignot + Myers LLC

(57) ABSTRACT

A semiconductor device with a current sampler and a start-up structure, comprises first, second and third high-voltage transistors, and a resistor, wherein: a drain terminal of the first transistor is respectively connected to a drain terminal of the second transistor, a drain terminal of the third transistor and one end of the resistor; a source terminal of the first transistor is grounded, and a gate terminal of the first transistor is connected to a gate terminal of the second transistor; the other end of the resistor is connected to a gate terminal of the third transistor; wherein the resistor is wound and formed in a common voltage withstand region of the first transistor, the second transistor and the third transistor, or in a voltage withstand region of the first transistor only, or in the voltage withstand region of the third transistor only.

7 Claims, 4 Drawing Sheets

SEMICONDUCTOR DEVICE WITH A CURRENT SAMPLER AND A START-UP STRUCTURE

CROSS-REFERENCE TO RELATED APPLICATIONS

The present invention claims priority from Chinese Patent Application Ser. No. 201310112448.8 filed Apr. 2, 2013, which is incorporated herein by reference for all purposes.

FIELD OF THE INVENTION

The present invention relates to a semiconductor device with a current sampler and a start-up structure suitable for an AC-DC switching power supply circuit, and belongs to the technical field of power semiconductor.

BACKGROUND OF THE INVENTION

The structure of a traditional AC-DC switching power supply integrated chip is shown in FIG. 1, wherein the start-up circuit 101 and the PWM (Pulse Width Modulation) circuit 102 are integrated together as the control circuit 103, and the power switching transistor acts as the output stage. When the chip is operating, the control circuit outputs driving signals to control the power switching transistor to be in a conducting state or a non-conducting state, and the current of the power switching transistor is sampled through a resistor and is fed back to the control circuit.

In recent years, along with the continuous development of the switching power supply integrated circuit, people are paying more and more attention to high efficiency and low production cost of chips, therefore there is a need to design an advanced semiconductor device.

SUMMARY OF THE INVENTION

The object of the present invention is to overcome the defects in the prior art, to provide a semiconductor device with a current sampler and a start-up structure, which is easily integrated with a low voltage control chip, so as to improve the efficiency and reduce the production cost.

The object of the present invention is achieved by the following technical scheme:

A semiconductor device with a current sampler and a start-up structure comprises a first transistor, a second transistor, a third transistor and a resistor; a drain terminal of the first transistor is respectively connected to a drain terminal of the second transistor, a drain terminal of the third transistor and one end of the resistor; a source terminal of the first transistor is grounded, and a gate terminal of the first transistor is connected to a gate terminal of the second transistor; the other end of the resistor is connected to a gate terminal of the third transistor; the first transistor, the second transistor and the third transistor are all high voltage transistors; and the resistor is wound and formed in a common voltage withstand region of the first transistor, the second transistor and the third transistor, or in a voltage withstand region of the first transistor only, or in the voltage withstand region of the third transistor only.

Preferably, the first transistor, the second transistor and the third transistor are lateral high voltage transistors; and the voltage withstand region of each lateral high voltage transistor is its drift region.

Preferably, the first transistor, the second transistor and the third transistor are vertical high voltage transistors; and the voltage withstand region of each vertical high voltage transistor is its termination structure region.

Preferably, the first transistor, the second transistor, the third transistor and the resistor are integrated into a single silicon chip.

Preferably, size of the second transistor is smaller than size of the first transistor.

Preferably, the resistor is a polysilicon resistor.

Preferably, the third transistor is an enhancement type MOSFET, or a depletion type MOSFET, or a JFET (namely, a junction field effect transistor).

The technical scheme of the present invention has prominent substantive features and represents notable progresses as follows:

1. In the semiconductor device of the present invention, the first high voltage transistor acts as the power switch, the second lateral high-voltage transistor acts as the current sampler for the first transistor, and the third high-voltage transistor and the resistor together act as the start-up structure. The semiconductor device including the start-up structure and the current sampler have small area and low production cost, and it is self-isolated from the low voltage control circuit.

2. Size of the second high voltage transistor is smaller than that of the first high voltage transistor. The lager current of the second high voltage transistor is obtained by sampling the smaller current of the second high voltage and calculating according to the circuit, wherein the sampling of smaller current can reduce the energy loss of the system. The third high-voltage transistor and the resistor constitute the start-up structure, which is connected to the low voltage control circuit, so as to implement the function of starting. After the low voltage control circuit is started, the third high-voltage transistor will be switched off, which reduces the energy loss of the system.

3. The third transistor is an enhancement type MOSFET, or a depletion type MOS, or a junction field effect transistor (JFET), which can be applicable for different process technology. When the resistor is wound and formed with doped polycrystalline silicon in a voltage withstand region, the electric field on the surface of the voltage withstand region is reduced, the reliability of the device is improved, and the occupied area in the chip is reduced greatly. In the semiconductor device of the present invention, the power switch, the high-voltage start-up structure and the current sampler are integrated into a single silicon chip, which makes the production cost of the system lower.

BRIEF DESCRIPTION OF THE DRAWINGS

The technical scheme of the present invention will be described in more details with reference to the accompanying figures.

DETAILED DESCRIPTION OF THE PREFERRED EMBODIMENTS

In the semiconductor device of the present invention, a high-voltage start-up structure, a current sampler and a power switch are integrated, which reduces energy loss in starting the circuit and reduces the energy loss in current sampling by the power transistor; additionally, the high-voltage start-up structure, the current sampler and the power switch are integrated into a single silicon chip, which further reduces the production cost of the system.

The semiconductor device with a current sampler and a start-up structure comprises a first transistor, a second transistor, a third transistor and a resistor, wherein the first transistor acts as the power switch, the second transistor acts as the current sampler for the first transistor, the third transistor and the resistor together act as the start-up structure; wherein the drain terminal of the first transistor is respectively connected to the drain terminal of the second transistor, the drain terminal of the third transistor, and one end of the resistor; the source terminal of the first transistor is grounded, and the gate terminal of the first transistor is connected to the gate terminal of the second transistor; the other end of the resistor is connected to the gate terminal of the third transistor; the first transistor, the second transistor and the third transistor are all high voltage transistors; the resistor is wound and formed in a common voltage withstand regions of the first transistor, the second transistor and the third transistor, or in the voltage withstand region of the first transistor only, or in the voltage withstand region of the third transistor only.

The first transistor, the second transistor and the third transistor are lateral high voltage transistors, and the voltage withstand region of each lateral high voltage transistor is its drift region.

Alternatively, the first transistor, the second transistor and the third transistor are vertical high voltage transistors, and the voltage withstand region of each vertical high voltage transistor is its termination structure region.

The first transistor, the second transistor, the third transistor and the resistor are integrated into a single silicon chip.

Size of the second transistor is smaller than that of the first transistor.

The resistor is a polysilicon resistor.

The third transistor is an enhancement type MOSFET, or a depletion type MOSFET, or a junction field effect transistor (JFET). The third transistor can have a negative voltage threshold and a positive voltage threshold as well.

Figure 1:
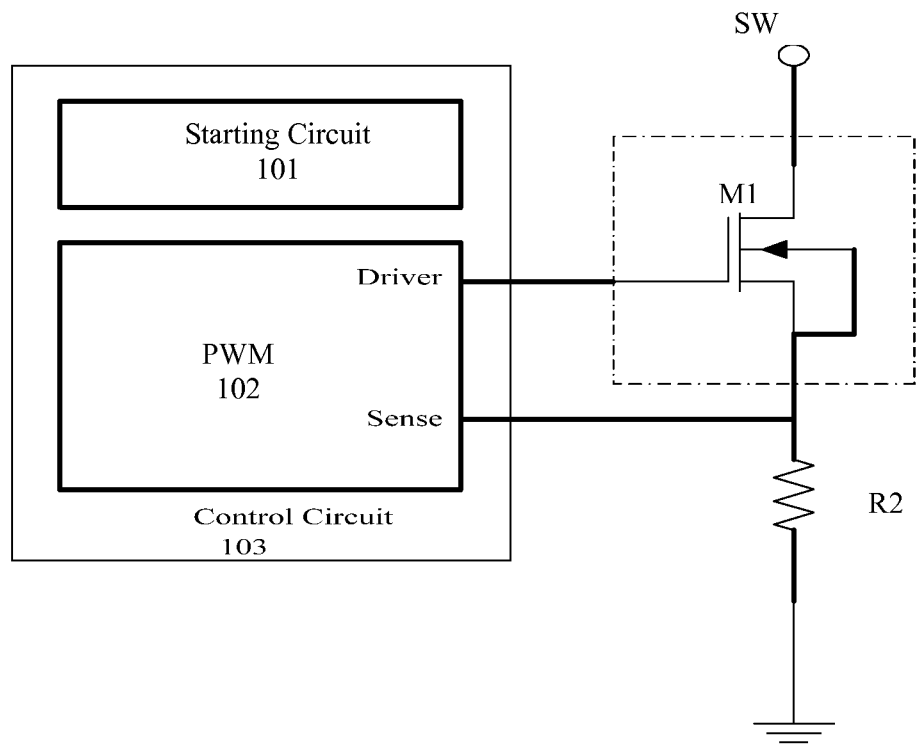
FIG. 1 is a block diagram of a traditional switching power supply integrated chip.
Figure 2:
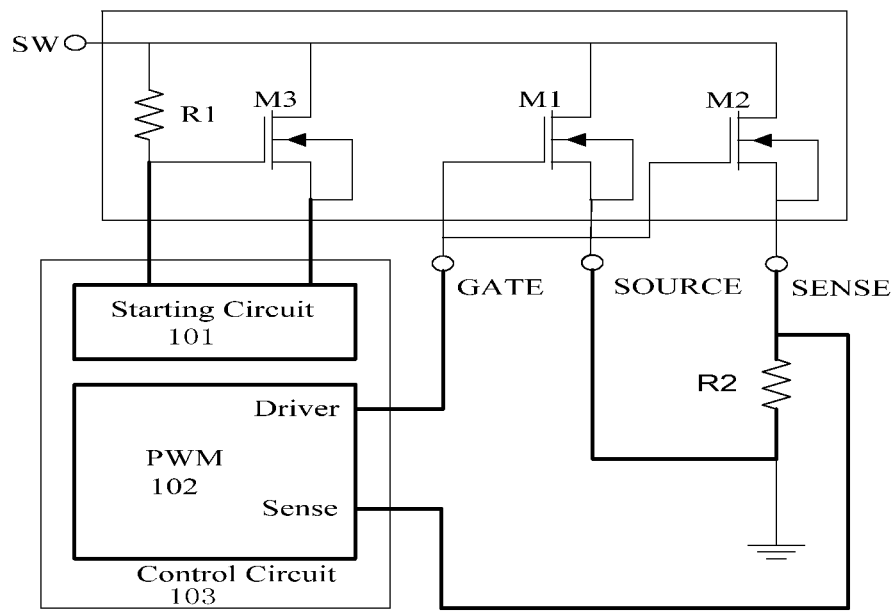
FIG. 2 is a block diagram of a switching power supply integrated chip with intelligent power elements according to the present invention.

As shown in FIG. 2, the semiconductor device with a current sampler and a start-up structure comprises transistors M1, M2, M3 and the resistor R1, wherein SW is a high voltage terminal; GATE is an output terminal for the driving signal; SOURCE is the grounded source terminal of the switching transistor M1; SENSE is the source terminal of the sampling transistor M2, and is grounded through the sampling resistor R2, the sampling signal is output from the SENSE to the control circuit 103. During the power-up, the gate voltage of M3 rises slowly. When the gate voltage is greater than the threshold voltage, M3 is in a conducting state, and charges an external capacitor through the starting circuit 101, and simultaneously, a negative feedback loop is constructed by elements in the starting circuit and the resistor R1 to control the gate voltage of M3, which makes the charging current of M3 for the external capacitor stable and avoids bad effects caused by the variation of the capacitor voltage and the variation of the drain voltage.

Figure 5:
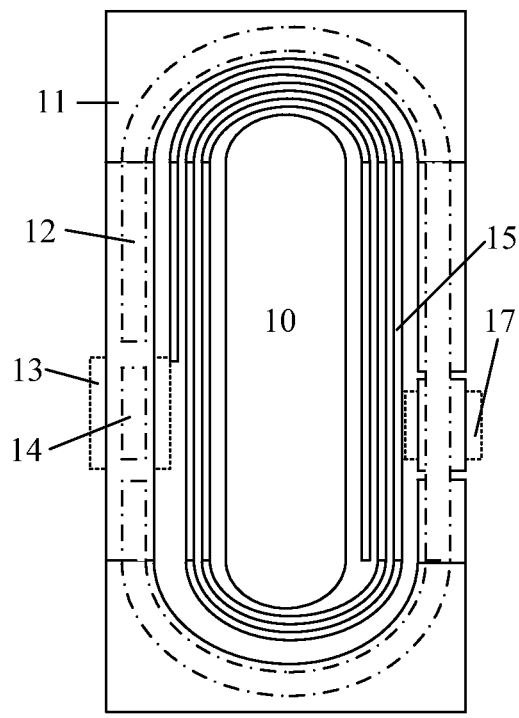
FIG. 5 is a schematic diagram illustrating the semiconductor device with a current sampler and a start-up structure according to the first embodiment of the present invention.

As shown in FIG. 5, in the first preferred embodiment of the semiconductor device with a current sampler and a start-up structure of the present invention, the first transistor, the second transistor and the third transistor are all lateral high voltage transistors. The first transistor comprises the drain region 10, the source region 13 and the gate region 12; the second transistor comprises the drain region 10, the source region 17 and the gate region 12; the third transistor comprises the drain region 10, the source region 13 and the gate region 14. The resistor 15 is wound and formed in the lateral drift region of the first transistor. One end of the resistor 15 is connected to the drain region 10 of the first transistor, and the other end of the resistor 15 is connected to the gate region 14 of the third transistor.

Figure 6:
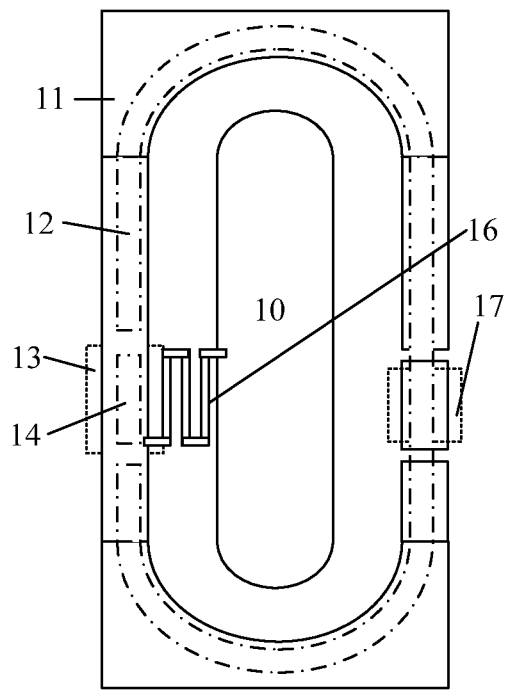
FIG. 6 is a schematic diagram illustrating the semiconductor device with a current sampler and a start-up structure according to the second embodiment of the present invention.

As shown in FIG. 6, in the second preferred embodiment of the semiconductor device with a current sampler and a start-up structure of the present invention, the transistors are lateral high voltage transistors. The first transistor comprises the drain region 10, the source region 11 and the gate region 12; the second transistor comprises the drain region 10, the source region 17 and the gate region 12; the third transistor comprises the drain region 10, the source region 13 and the gate region 14. The resistor 16 is wound and formed in the lateral drift region of the third transistor. One end of the resistor 16 is connected to the drain region 10 of the first transistor, and the other end of the resistor 16 is connected to the gate region 14 of the third transistor.

Figure 7:
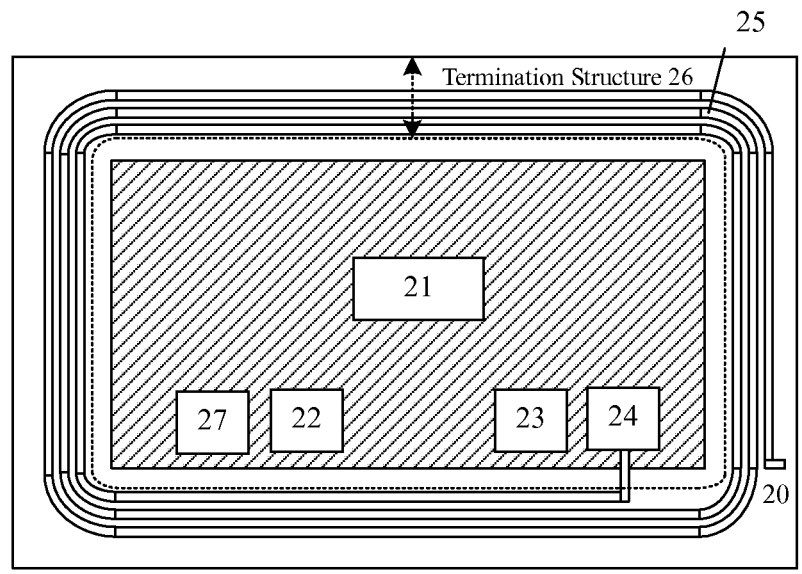
FIG. 7 is a schematic diagram illustrating the semiconductor device with a current sampler and a start-up structure according to the third embodiment of the present invention.

As shown in FIG. 7, in the third preferred embodiment of the semiconductor device with a current sampler and a start-up structure of the present invention, the first transistor, the second transistor and the third transistor are all vertical high voltage transistors. The first transistor comprises the drain region 20, the source region 21 and the gate region 22; the second transistor comprises the drain region 20 (the bottom of the epitaxial layer is also the drain region, which is not shown in the figure), the source region 27 and the gate region 22; the third transistor comprises the drain region 20, the source region 23 and the gate region 24. The resistor 25 is wound and formed in the termination structure 26 of the first transistor, the second transistor and the third transistor. One end of the resistor 25 is connected to the drain region 20 of the first transistor, and the other end of the resistor 25 is connected to the gate region 24 of the third transistor.

Figure 8:
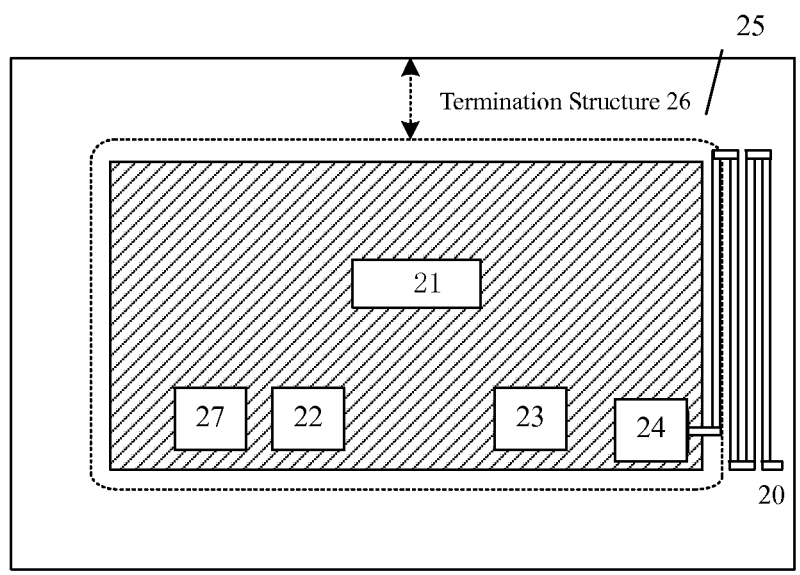
FIG. 8 is a schematic diagram illustrating the semiconductor device with a current sampler and a start-up structure according to the fourth embodiment of the present invention.

As shown in FIG. 8, in the fourth preferred embodiment of the semiconductor device with a current sampler and a start-up structure of the present invention, the first transistor, the second transistor and the third transistor are all vertical high voltage transistors. The first transistor comprises the drain region 20, the source region 21 and the gate region 22; the second transistor comprises the drain region 20 (the bottom of the epitaxial layer is also the drain region, which is not shown in the figure), the source region 27 and the gate region 22; the third transistor comprises the drain region 20, the source region 23 and the gate region 24. The resistor 25 is wound and formed in part of the termination structure 26 of the first transistor, the second transistor and the third transistor. One end of the resistor 25 is connected to the drain region 20 of the first transistor, and the other end of the resistor 25 is connected to the gate region 24 of the third transistor.

In the semiconductor device of the present invention, the first high voltage transistor acts as the power switch, the second high-voltage transistor acts as the current sampler for the first transistor, and the third high-voltage transistor and the resistor together act as the start-up structure. The semiconductor device including the start-up structure and the current sampler have small area and low production cost, and it is self-isolated from the low voltage control circuit.

Figure 3:
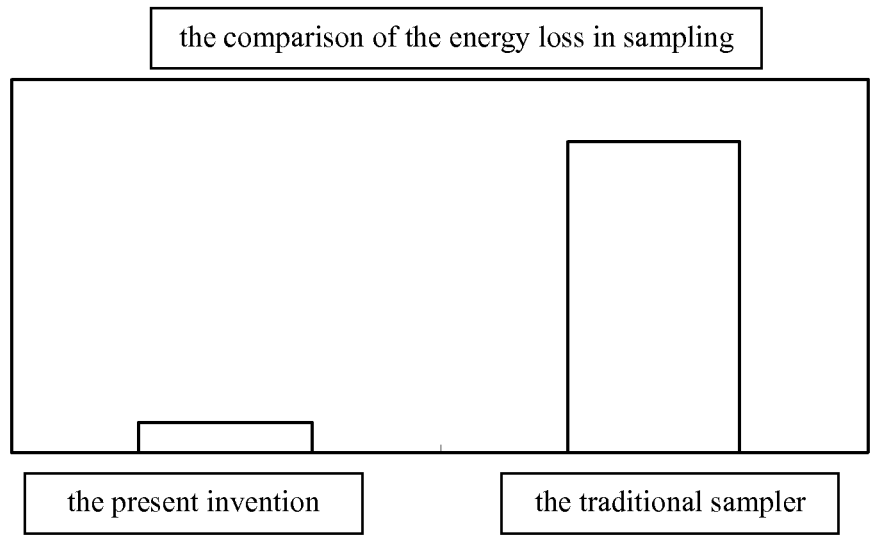
FIG. 3 shows a comparison of energy loss between sampling with the sampler of the semiconductor device of the present invention and sampling with a traditional resistor.

Size of the second high voltage transistor is smaller than that of the first high voltage transistor. The lager current of the second high voltage transistor is obtained by sampling the smaller current of the second high voltage and calculating through the circuit, wherein the sampling of smaller current can reduce the energy loss of the system. Compared with the traditional sampler for the first high voltage transistor, the sampler of the present invention reduces the energy loss of the system considerably and improves the efficiency of the system. The comparison of energy loss between sampling with the sampler of the semiconductor device of the present invention and sampling with a traditional sampler is shown in FIG. 3.

Figure 4:
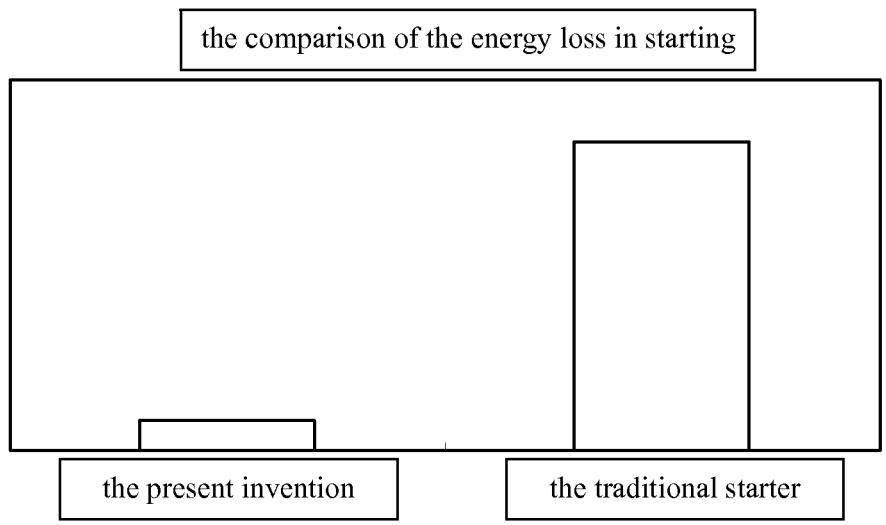
FIG. 4 shows a comparison of energy loss between starting with the start-up structure of the semiconductor device of the present invention and starting with a traditional resistor.

The third high-voltage transistor and the resistor constitute the start-up structure, which is connected to the low voltage control circuit, so as to implement the function of starting. After the low voltage control circuit is started, the third high-voltage transistor circuit is switched off, which reduces the energy loss of the system. Compared with the traditional start-up structure, the start-up structure of the present invention reduces the energy loss of the system considerably and improves the efficiency of the system. The comparison of the energy loss c between starting with the start-up structure of the semiconductor device of the present invention and starting with a traditional start-up structure is shown in FIG. 4.

The third transistor is an enhancement type MOSFET, or a depletion type MOS, or a junction field effect transistor (JFET), which can be applicable to different process technology.

When the resistor is wound and formed with doped polycrystalline silicon in a voltage withstand region, the electric field on the surface of the voltage withstand region is reduced, the reliability of the device is improved, and the occupied area in the chip is reduced greatly.

In the semiconductor device of the present invention, the power switch, the high-voltage start-up structure and the current sampler are integrated into a single silicon chip, which makes the production cost of the system lower.

It should be understood that the present invention is not restricted to the preferred embodiments. Various modifications or identical replacements may be made based on the principles of the present invention without departing from the scope of the invention.

What is claimed is:

1. A semiconductor device with a current sampler and a start-up structure, comprising a first transistor, a second transistor, a third transistor and a resistor, wherein, the drain terminal of the first transistor is respectively connected to the drain terminal of the second transistor, the drain terminal of the third transistor and one terminal of the resistor; the source terminal of the first transistor is grounded, and the gate terminal of the first transistor is connected to the gate terminal of the second transistor; the other terminal of the resistor is connected to the gate terminal of the third transistor; wherein, the first transistor, the second transistor and the third transistor are all high voltage transistors; and the resistor is wound and formed in a common voltage withstand region of the first transistor, the second transistor and the third transistor.

2. The semiconductor device with a current sampler and a start-up structure according to claim 1, wherein, the first transistor, the second transistor and the third transistor are lateral high voltage transistors; and wherein the voltage withstand region of each lateral high voltage transistor is its drift region.

3. The semiconductor device with a current sampler and a start-up structure according to claim 1, wherein the first transistor, the second transistor and the third transistor are vertical high voltage transistors; and wherein the voltage withstand region of each vertical high voltage transistor is its termination structure region.

4. The semiconductor device with a current sampler and a start-up structure according to claim 1, wherein, the first transistor, the second transistor, the third transistor and the resistor are integrated into a single silicon chip.

5. The semiconductor device with a current sampler and a start-up structure according to claim 1, wherein the second transistor is smaller in size than the first transistor.

6. The semiconductor device with a current sampler and a start-up structure according to claim 1, wherein the resistor is comprised of a polysilicon resistor.

7. The semiconductor device with a current sampler and a start-up structure according to claim 1, wherein the third transistor is selected from the group consisting of an enhancement type MOSFET, a depletion type MOSFET, and a JFET.

\* \* \* \* \*